United States Patent
Lavine

(10) Patent No.: US 7,095,066 B2
(45) Date of Patent: Aug. 22, 2006

(54) PROCESS FOR MAKING A CMOS IMAGE SENSOR

(75) Inventor: James P. Lavine, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/753,246

(22) Filed: Jan. 8, 2004

(65) Prior Publication Data

US 2005/0151055 A1    Jul. 14, 2005

(51) Int. Cl.
*H01L 31/062* (2006.01)

(52) U.S. Cl. .................. 257/292; 257/290; 257/291; 257/293; 438/48

(58) Field of Classification Search ............... 257/233, 257/239, 290–294; 438/48, 70
See application file for complete search history.

(56) References Cited

U.S. PATENT DOCUMENTS

| 6,040,593 | A | * | 3/2000 | Park ........................ 257/292 |
| 6,344,368 | B1 | | 2/2002 | Pan |
| 6,344,669 | B1 | | 2/2002 | Pan |
| 6,429,036 | B1 | | 8/2002 | Nixon et al. |
| 6,501,065 | B1 | | 12/2002 | Uppal et al. |
| 6,852,591 | B1 | * | 2/2005 | Rhodes ...................... 438/244 |
| 2003/0025160 | A1 | | 2/2003 | Suzuki et al. |

\* cited by examiner

*Primary Examiner*—Donghee Kang
(74) *Attorney, Agent, or Firm*—Peyton C. Watkins

(57) ABSTRACT

An image sensor includes a semi-conducting substrate having a photo-sensitive region and doping for forming a path to a charge-to-voltage mechanism; a dielectric spanning the substrate; and a semi-conducting layer, which is less than approximately 1 micrometer, spanning the dielectric which contains electrodes and circuit elements that control flow of charge.

16 Claims, 2 Drawing Sheets

PROCESS FOR MAKING A CMOS IMAGE SENSOR

FIELD OF THE INVENTION

The invention relates to the field of image sensors and, more particularly, to making an image sensor in a wafer that has the structure of a semi-conductor layer over a dielectric layer that is over a semi-conducting substrate. More specifically, the invention relates to making an image sensor with the photosensitive region in the semi-conducting substrate and most of the signal transport and processing circuits in the semi-conducting layer.

BACKGROUND OF THE INVENTION

CMOS technology continues to have a trend of finer dimensions with shallower active device volumes. When CMOS technology is used to fabricate an image sensor, then a tradeoff conflict arises as a shrinking active device volume means the quantum efficiency is severely reduced, i.e., the optical sensitivity of an image sensor drops. This trend is most clearly seen when CMOS utilizes silicon on insulator (SOI) wafers with the top silicon layer of the order of 1.0 μm or less in thickness.

Several methods have been described to achieve better quantum efficiency in a CMOS image sensor. U.S. Pat. No. 6,429,036 teaches the use of backside illumination in conjunction with a thinned silicon CMOS image sensor. However, thinning is a difficult operation that has the possibility of a low success rate. U.S. Pat. Nos. 6,501,065; 6,344,368; and 6,344,669 teach the use of an amorphous silicon layer atop the CMOS circuits for the photosensitive element. Amorphous silicon is a challenging material from which to extract photo-generated carriers, since amorphous silicon generally has a high density of trapping sites for the carriers. Suzuki et al. in U.S. Patent application no. 2003/0025160 teach how to combine backside illumination with CMOS circuits in a silicon layer. However, the fabrication requires many instances of non-standard process steps.

The present invention circumvents the difficulties mentioned above and achieves better quantum efficiency with standard CMOS process steps.

SUMMARY OF THE INVENTION

The present invention is directed to overcoming this reduced quantum efficiency when SOI wafers are utilized to fabricate image sensors. Briefly summarized, according to one aspect of the present invention, the invention resides in an image sensor having a semi-conducting substrate having a photo-sensitive region and doping for forming a path to a charge-to-voltage mechanism; a dielectric spanning the substrate; and a semi-conducting layer, which is less than approximately 1 micrometer, spanning the dielectric which contains electrodes and circuit elements that control flow of charge.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantages. Sufficient semi-conducting volume is retained for the image sensor built in SOI to have a quantum efficiency comparable to that of image sensors built in standard semi-conductor wafers. The semi-conducting layer over the photosensitive region may be replaced by a dielectric layer or dielectric layers that permit increased quantum efficiency by the reduction of absorptive or reflective losses in the layers over the photosensitive region.

DETAILED DESCRIPTION OF THE INVENTION

Figure 1:
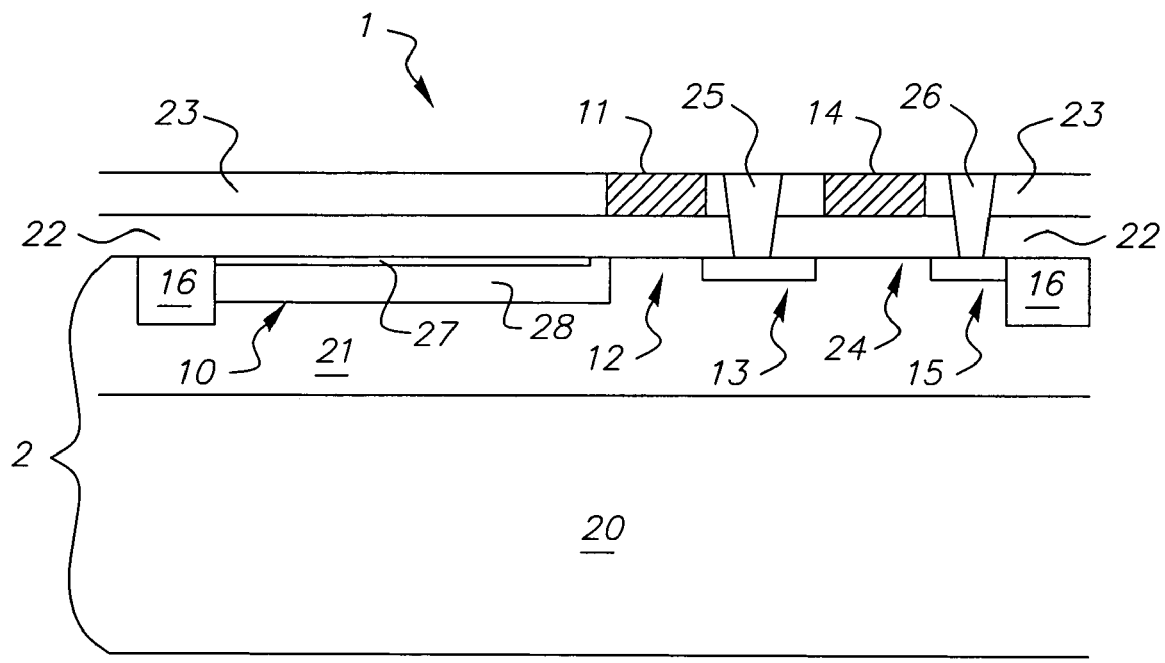
FIG. 1 is a view in cross section of the image sensor of the present invention.
Figure 2:
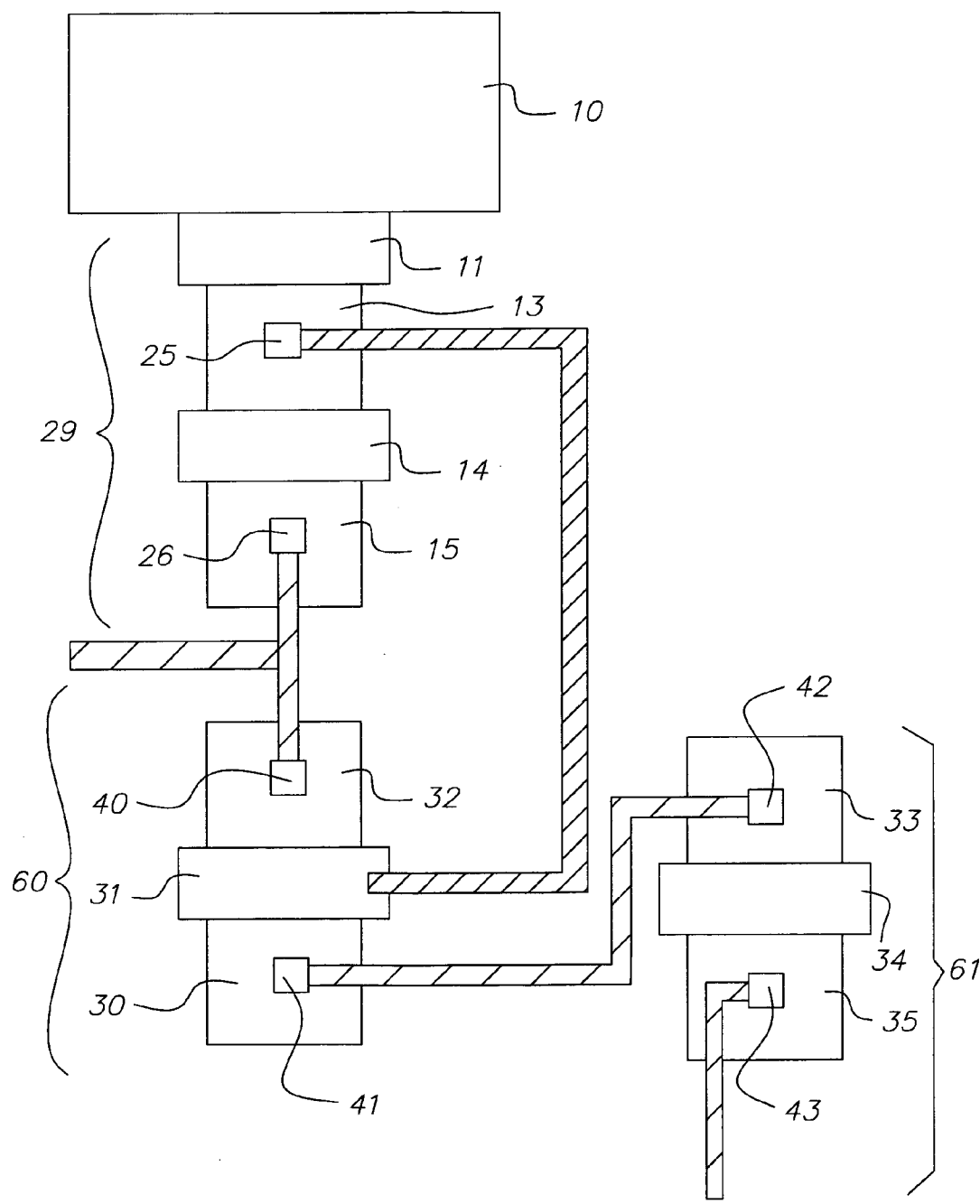
FIG. 2 is a top view of FIG. 1.

Referring to FIGS. 1 and 2, there is shown a CMOS image sensor 1 of the present invention. Although a CMOS image sensor is shown as a preferred embodiment, the present invention applies to any suitable image sensor such as a charge coupled device (CCD). The present invention is also preferably implemented on a silicon on insulator wafer which consists of a layer of silicon overlayer 23 on a layer of silicon dioxide 22 which rests on a thick silicon substrate 2. The thick silicon substrate 2 includes two doping regions comprising a first 20 and second layer 21. The second layer region 21 is preferable an epitaxial region. A dielectric layer 22 spans and covers the epitaxial region 21. The silicon overlayer 23 covers and spans the dielectric layer 22. The silicon overlayer 23 is preferably made of a single crystal and is preferably less than 1 micrometer in thickness.

A pinned photodiode 10 having a p+ layer 27 and an n layer 28 is disposed in the epitaxial layer 21. The pinned photodiode 10 collects charge generated by incident light. A transfer gate 11 is disposed in the silicon overlayer 23 for transferring charge from the pinned photodiode 10 via the transfer channel 12. A charge-to-voltage mechanism 13, preferably a floating diffusion, is disposed in the epitaxial layer 21 for receiving the charge from the pinned photodiode 10 and converting the charge to a voltage. The contact 25 for the floating diffusion 13 extends from the silicon overlayer 23 into the floating diffusion 13. The voltage is applied to the gate of a source follower 60 which in turn is connected to a row select transistor 61 for permitting the voltage signal to be read out. Isolation regions are represented by 16 for providing isolation between pixels.

A reset transistor 29 generally includes transistor elements typically comprising source 13, gate 14, drain 15, channel 24 and contacts 25 and 26 for permitting the resetting of the floating diffusion. The gate 31 of the source follower 60 is connected to the floating diffusion 13 through the contact 25. The output of the source follower 60 goes to the input of the row select transistor 61. The source follower 60 includes well-known components such as a drain 30, gate 31, source 32 and contacts 40 and 41. The row select transistor 61 includes well known components such as source 33, gate 34, drain 35 and contacts 42 and 43. It is instructive to note that the source follower and row select transistor are disposed in the silicon overlayer.

Figure 3:
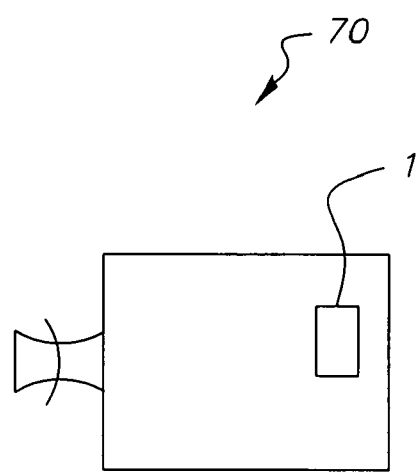
FIG. 3 is a side view of a camera for implementing a commercial embodiment of the image sensor of the present invention.

Referring to FIG. 3, there is shown a camera 70 having the image sensor 1 for illustrating a commercial embodiment to which an ordinary consumer is accustomed.

The invention has been described with reference to a preferred embodiment. However, it will be appreciated that variations and modifications can be effected by a person of ordinary skill in the art without departing from the scope of the invention. For example, it is noted that the pinned photodiode 10 is disposed in the epitaxial layer 21 and a portion of the associative read out circuitry is disposed in the silicon over layer 23 for permitting higher quantum efficiency in the photodiode 10. Also, the present invention describes a four transistor embodiment with pinned photodiode 10, but it is evident that the same method can be used to provide a pixel with a different number of transistors and/or a different type of photo-sensitive elements.

PARTS LIST 1 image sensor
2 thick silicon substrate
10 pinned photodiode
11 transfer gate
12 transfer gate channel
13 charge-to-voltage mechanism/floating diffusion
14 reset gate
15 drain of reset transistor
16 isolation regions
20 first layer
21 second (epitaxial) layer
22 silicon dioxide/dielectric layer
23 silicon overlayer
24 channel of reset transistor
25 contact
26 contact
27 p+ layer
28 n layer
29 reset transistor
30 drain
31 gate
32 source
33 source
34 gate
35 drain
40 contact
41 contact
42 contact
43 contact
60 source follower transistor
61 row select transistor
70 camera

What is claimed is:

1. An image sensor comprising:
   (a) a semi-conducting substrate having a photo-sensitive region and doping for forming a path to a charge-to-voltage mechanism;
   (b) a dielectric spanning the substrate; and
   (c) a single crystal semi-conducting layer, which is less than approximately 1 micrometer, spanning the dielectric which contains electrodes and circuit elements that control flow of charge.

2. The image sensor as in claim 1, wherein the semi-conducting substrate and semi-conducting layer are silicon.

3. The image sensor as in claim 2, wherein the dielectric is silicon dioxide.

4. The image sensor as in claim 3, wherein the semi-conducting substrate includes an epitaxial layer.

5. The image sensor as in claim 1 further comprising doping for a reset transistor in the semi-conducting substrate and a reset gate in the semi-conducting layer.

6. The image sensor as a claim 1, wherein the photo-sensitive region is a photodiode.

7. The image sensor as in claim 1, wherein the charge-to-voltage mechanism is a floating diffusion.

8. The image sensor as in claim 1, wherein the image sensor is a CMOS image sensor.

9. A camera comprising:
   an image sensor comprising:
   (a) a semi-conducting substrate having a photo-sensitive region and doping for forming a path to a charge-to-voltage mechanism;
   (b) a dielectric spanning the substrate; and
   (c) a single crystal semi-conducting layer, which is less than approximately 1 micrometer, spanning the dielectric which contains electrodes and circuit elements that control flow of charge.

10. The camera as in claim 9, wherein the semi-conducting substrate and semi-conducting layer are silicon.

11. The camera as in claim 10, wherein the dielectric is silicon dioxide.

12. The camera as in claim 11, wherein the semi-conducting substrate includes an epitaxial layer.

13. The camera as in claim 9 further comprising doping for a reset transistor in the semi-conducting substrate and a reset gate in the semi-conducting layer.

14. The camera as in claim 9, wherein the photo-sensitive region is a photodiode.

15. The camera as in claim 9, wherein the charge-to-voltage mechanism is a floating diffusion.

16. The camera as in claim 9, wherein the image sensor is a CMOS image sensor.

\* \* \* \* \*